United States Patent

Lakhani et al.

[11] Patent Number: 5,930,175
[45] Date of Patent: Jul. 27, 1999

[54] VOLTAGE PUMP SWITCH

[75] Inventors: Vinod Lakhani, Milpitas; Christophe J. Chevallier, Palo Alto, both of Calif.

[73] Assignee: Micron Technology, Inc., Boise, Id.

[21] Appl. No.: 08/916,604

[22] Filed: Aug. 22, 1997

[51] Int. Cl.[6] .................................................. G11C 13/00
[52] U.S. Cl. .................... 365/185.33; 365/218; 365/201; 365/189.09
[58] Field of Search ................. 365/189.01, 185.01, 365/185.33, 218, 201, 189.09

[56] References Cited

U.S. PATENT DOCUMENTS 5,212,442  5/1993  O'Toole ................................. 365/201
5,619,459  4/1997  Gilliam ................................. 365/201

OTHER PUBLICATIONS

Dipert, B., et al., "Flash Memory Goes Mainstream", *IEEE Spectrum*, 30, 48–52, (1993).

*Primary Examiner*—Terrell W. Fears
*Attorney, Agent, or Firm*—Schwegman, Lundberg, Woessner & Kluth P.A.

[57] ABSTRACT

A standard single well (e.g., n-well) complementary metal-oxide-semiconductor (CMOS) process compatible voltage pump switch routes −10 Volt for erasing a floating gate transistor when an IC substrate is grounded at 0 Volts. The voltage pump switch also routes extreme positive voltages for programming or reading the floating gate transistor. P-channel field-effect transistors (PFETs) multiplex both the read/write/programming and erasing voltages, such as in a block-erasable flash electrically erasable and programmable read only memory (EEPROM). The voltage pump switch includes a charge pump for providing to the PFET routing the erasing voltage a gate voltage that is more negative than the erasing voltage by the PFET turn-on threshold voltage ($V_T$) magnitude.

34 Claims, 7 Drawing Sheets

VOLTAGE PUMP SWITCH

TECHNICAL FIELD OF THE INVENTION

This invention relates generally to integrated circuits and more particularly, but not by way of limitation, to a positive and pumped negative voltage switch for programming and erasing a flash electrically programmable and erasable read only memory (EEPROM).

BACKGROUND OF THE INVENTION

Electronic systems, such as computer systems, often require nonvolatile storage of data. For example, it is desirable to retain certain binary coded data when a computer system is powered down. Magnetic hard disk systems have dominated nonvolatile data storage media for computers and related electronic systems due to the low cost and high capacity of available magnetic hard disk systems. Magnetic hard disk drives operate by storing binary coded data as polarities on a magnetic media which can be rewritten quickly and as often as desired. Magnetic hard disk drives are bulky, somewhat delicate, and require large power consumption and movable parts that pose potential reliability problems.

Flash memory systems provide a compact, rugged, and low power consumption integrated circuit alternative to magnetic hard disk systems for nonvolatile data storage. A flash memory system typically includes an electrically isolated (floating) gate transistor memory cell as an electrically erasable and programmable read only memory (EEPROM) nonvolatile data storage element. The flash memory system architecture differs from a conventional EEPROM architecture in that the memory cells in a flash memory system are arranged in blocks and can be erased a block at a time and programmed a bit at a time. For an example of operation of a flash memory system, see B. Dipert et al. "Flash Memory Goes Mainstream," IEEE Spectrum, Vol. 30, No. 10, pp. 48–52, October 1993.

The floating gate transistor is programmed by charge transport of electrons across a gate insulator onto the floating gate for storage. The floating gate transistor is erased removing the stored electrons from the floating gate and transporting these charges back across the gate insulator. The floating gate transistor is read by detecting a current, the conductance of which varies depending on whether or not electrons are stored on the floating gate.

One example of programming an n-channel floating gate field-effect transistor (FET) includes applying approximately +12 Volts between a select/control gate (control gate), which is capacitively coupled to the floating gate, and a source region of the FET. Approximately +6 Volts is applied between a drain region of the FET and the source region. Electrons are accelerated from the source region toward the drain region in a channel region formed between the source and drain regions. The electrons acquire kinetic energy, thereby freeing additional electrons that are accelerated toward the drain region. High energy "hot" electrons are attracted across the energy barrier of the gate insulator by the electric field resulting from the high voltage applied to the control gate. The electrons that accumulate on the floating gate raise a turn-on threshold voltage ($v_T$) magnitude that inhibit current conductance between the drain and source regions when a read voltage is applied to the control gate during a read operation.

One example of erasing the n-channel floating gate FET includes applying approximately −10 Volts to the control gate, +5 Volts to the source region, and isolating (floating) the drain region of the FET. Electrons that were previously stored on the floating gate are removed from the floating gate by Fowler-Nordheim tunneling of the electrons across the underlying gate insulator. The $V_T$ magnitude is decreased toward its unprogrammed value, allowing current conduction between drain and source regions when a read voltage is applied to the control gate during a read operation.

The large negative erasing control gate voltage required by the floating gate must be selectively applied to the particular block of memory cells being erased. For example, a separate power supply circuit can be dedicated to each block of memory cells to provide the large negative erasing voltage to the particular block of memory cells being erased. Alternatively, a single power supply circuit can be used to provide a common negative erasing voltage for all the blocks of memory cells, and an n-channel FET switch can be provided for each block of memory cells to route the large negative erasing voltage to the particular block of memory cells being erased.

As is well known in the art, n-channel FETs are typically preferred as switches for conducting voltages that are more negative than a control (gate) voltage. An n-channel FET becomes increasingly conductive as the gate voltage increasingly exceeds the source voltage. By applying a positive voltage to the gate that exceeds the source voltage by at least the n-channel FET's $V_T$ magnitude, the n-channel FET easily passes the source voltage to a drain region of the n-channel FET.

One drawback of the n-channel FET is that a source-to-substrate pn junction diode turns on and injects minority charge carriers into the substrate when the voltage at the source becomes substantially more negative than a voltage of the semiconductor substrate region in which the n-channel FET is fabricated. This leads to unwanted high current conditions, and possibly to a well-known positive feedback condition known as CMOS latchup, which can only be interrupted by de-powering of the integrated circuit.

Conventional design techniques avoid turning on the n-channel FET source-to-substrate pn junction diode by fabricating the n-channel FETs in a p-well region of the semiconductor substrate that can be held at the same voltage as the source region of the n-channel FET. This prevents diode turn-on by ensuring that substantially no voltage difference exists between source and substrate regions of the n-channel FET. However, formation of p-well region adds complexity and cost to the fabrication process. A standard single well complementary metal-oxide-semiconductor (CMOS) process typically provides a single well type, which is typically an n-well region in which p-channel FETs are fabricated. Forming the p-well region adds additional masking, ion-implantation, and thermal processing steps to the standard n-well CMOS process, which increases the cost of producing the integrated circuit.

For the reasons stated above, and for other reasons stated below which will become apparent to those skilled in the art upon reading and understanding the present specification, there is a need in the art of integrated circuits and flash memories to provide switching of extreme negative voltages that is compatible with an inexpensive n-well CMOS process, rather than requiring a more expensive twin-well or triple-well (i.e., well-in-well) process.

SUMMARY OF THE INVENTION

According to one aspect of the present invention, an integrated circuit having a reference voltage level includes a first p-channel field-effect transistor (PFET) that switchably electrically couples a first input voltage to an output based on a first gate voltage at the gate of the first PFET. The first input voltage is more negative than the reference voltage level. A second PFET switchably electrically couples a second input voltage to an output based on a second gate voltage at the gate of the second PFET. The second input voltage is more positive than or equal to the reference voltage level.

In another embodiment, the present invention provides a memory that includes an erasing voltage that is more negative than a reference voltage. At least one programming voltage is more positive than or equal to the reference voltage. The memory includes an array of memory cells. Each memory cell includes a floating gate transistor having a control gate, and constructed to respond to at least one programming voltage to change to at least one programmed state. The floating gate transistor is also constructed to respond to the erasing voltage to change to an erased state. A first PFET switch switchably electrically couples the erasing voltage to at least one memory cell, based on a first gate voltage at the gate of the first PFET.

According to another aspect of the present invention, a method of using a memory includes receiving a first input voltage that is more negative than a reference voltage. A received second input voltage is more positive than or equal to the reference voltage. The second input voltage is isolated from a selected block of memory cells. The first input voltage is isolated, by a second PFET, from the nonselected blocks of memory cells. The second input voltage is coupled to nonselected blocks of memory cells. The first input voltage is coupled, through a first PFET, to the selected block of memory cells.

The present invention provides switching for negative voltages, such as for selective application of a negative erasing voltage to particular blocks of memory integrated circuit (e.g., a flash memory having floating gate transistor memory cells), that is compatible with a standard single well (e.g., n-well) complementary metal-oxide-semiconductor (CMOS) process. A voltage pump switch uses a PFET to route an extreme negative erasing voltage to a particular memory cell block in a memory cell array. In order to pass the extreme negative erasing voltage, the gate of the PFET is charge-pumped to a voltage that is more negative than the extreme negative erasing voltage by the magnitude of the PFET turn-on threshold voltage. The present invention is also capable of routing extreme positive voltages to a particular block of memory cells, such as for reading or write/programming operations.

BRIEF DESCRIPTION OF THE DRAWINGS

In the drawings, like numerals describe substantially similar components throughout the several views.

DETAILED DESCRIPTION OF THE INVENTION

Figure 1:
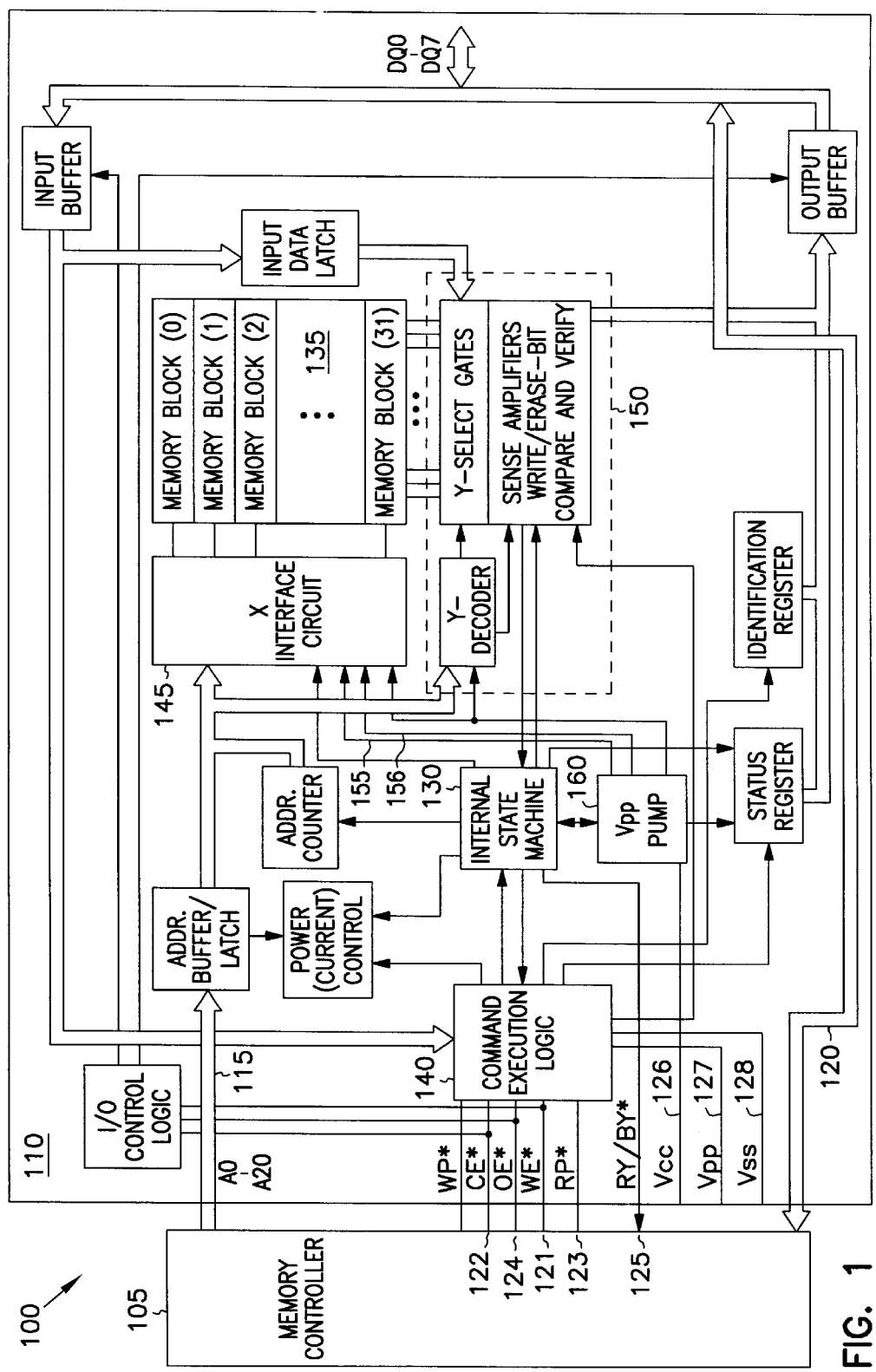
FIG. 1 is a schematic/block diagram illustrating generally one embodiment of a memory system 100 that includes a voltage pump switch.

In the following detailed description, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those skilled in the art to practice the invention. Other embodiments may be utilized and logical, structural, and electrical changes may be made without departing from the scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims and their equivalents.

One aspect of the present invention provides switching for negative voltages, such as for selective application of a negative erasing voltage to particular blocks of memory integrated circuit (e.g., a flash memory), that is compatible with a standard single well (i.e., n-well) complementary metal-oxide-semiconductor (CMOS) process.

MEMORY SYSTEM

FIG. 1 is a schematic/block diagram illustrating generally, by way of example, but not by way of limitation, one embodiment of a memory system 100 that includes a voltage pump switch, which provides a switchable negative erasing voltage according to one aspect of the present invention. Memory system 100 includes memory controller 105 and memory integrated circuit (IC) 110. Controller 105 includes a microprocessor or any other controller 105 providing interface signals to the memory IC 110, as described below. Such interface signals include addressing signals, provided at address lines 115, and data signals, communicated at data lines 120. Other interface signals provided by controller 105 include write enable (WE*) at node 121, chip enable (CE*) at node 122, reset/power-down (RP*) at node 123, and output enable (OE*) at node 124, all of which are active low signals. Memory IC 110 provides a status signal (RY/BY*) at node 125 to controller 105 to indicate the status of internal state machine 130. Memory IC 110 also receives a positive power supply voltage ($V_{cc}$) at node 126 (e.g., approximately 3.3 Volts or approximately 5 Volts), a write/erase supply voltage ($V_{pp}$) at node 127 (e.g., approximately 5 Volts), and a reference voltage such as substrate ground voltage ($V_{ss}$) at node 128 (e.g., approximately 0 Volts).

In the embodiment of FIG. 1, memory IC 110 includes a memory cell array 135 of floating gate transistor memory cells arranged in 32 memory cell blocks. Each memory cell block in memory cell array 135 contains 64 kilobytes of floating gate transistor memory cells. Data stored in each memory cell block is erased independently, as described below, without disturbing data stored in other memory cell blocks. A command execution logic module 140 receives the above-described interface signals from controller 105. Command execution logic module 140 controls internal state machine 130, which provides write and block erase timing sequences to memory cell array 135 through X-interface circuit 145 and Y-interface circuit 150.

Y-interface circuit 150 provides access to individual memory cells through data lines in memory cell array 135. Y-interface circuit 150 includes a Y-decoder circuit, Y-select gates, sense-amplifiers, and write/erase bit compare and verify circuits. X-interface circuit 145 provides access to rows of memory cells through wordlines in memory cell array 135, which are electrically coupled to control gates (also called select gates) of floating gate transistors in memory cell array 135. X-interface circuit 145 includes decoding and control circuits for erasing individual blocks of memory cells in memory cell array 135, as described below. X-interface circuit 145 receives a first input voltage 155 and a second input voltage 156 from $V_{pp}$ pump 160, as described below.

In one embodiment, $V_{pp}$ pump 160 includes charge pump circuits that draw power from the write/erase power supply voltage $V_{pp}$ at node 127. During a block erasing operation, a negative charge pump in $V_{pp}$ pump 160 is clocked such that it provides a first input voltage at node 155 that is a negative charge-pumped erasing voltage (e.g., approximately −10 Volts). However, during read or write/programming operations, the negative charge pump in $V_{pp}$ pump 160 is turned off, and the first input voltage at node 155 is switched to a reference voltage such as the substrate voltage $V_{ss}$ at node 128 (e.g., approximately 0 Volts), or the positive power supply voltage $V_{cc}$ at node 126 (e.g., approximately 3.3 Volts or 5 Volts).

During a write/programing operation, a positive charge pump in $V_{pp}$ pump 160 is clocked such that it provides a second input voltage at node 156 that is a positive charge-pumped programming voltage (e.g., approximately +10 Volts). However, during read operations, the second input voltage at node 156 is reduced (e.g., to approximately +7 Volts). During erasing operations, the second input voltage 156 is reduced, such as by turning off the positive charge pump in $V_{pp}$ pump 160 and switching the second input voltage 156 to a reference voltage (e.g., approximately between 0 Volts and 1 Volt). Table 1 is a truth table that summarizes exemplary values of the first input voltage at node 155 and the second input voltage at node 156 during read, write/programming, and erasing operations.

TABLE 1

| Operation | First Input Voltage (155) | Second Input Voltage (156) |
|---|---|---|
| Read | 0 Volts or $V_{CC}$ | +7 Volts |
| Program | 0 Volts or $V_{CC}$ | +10 Volts |
| Erase | −10 Volts | 0 to +1 Volt |

Figure 2:
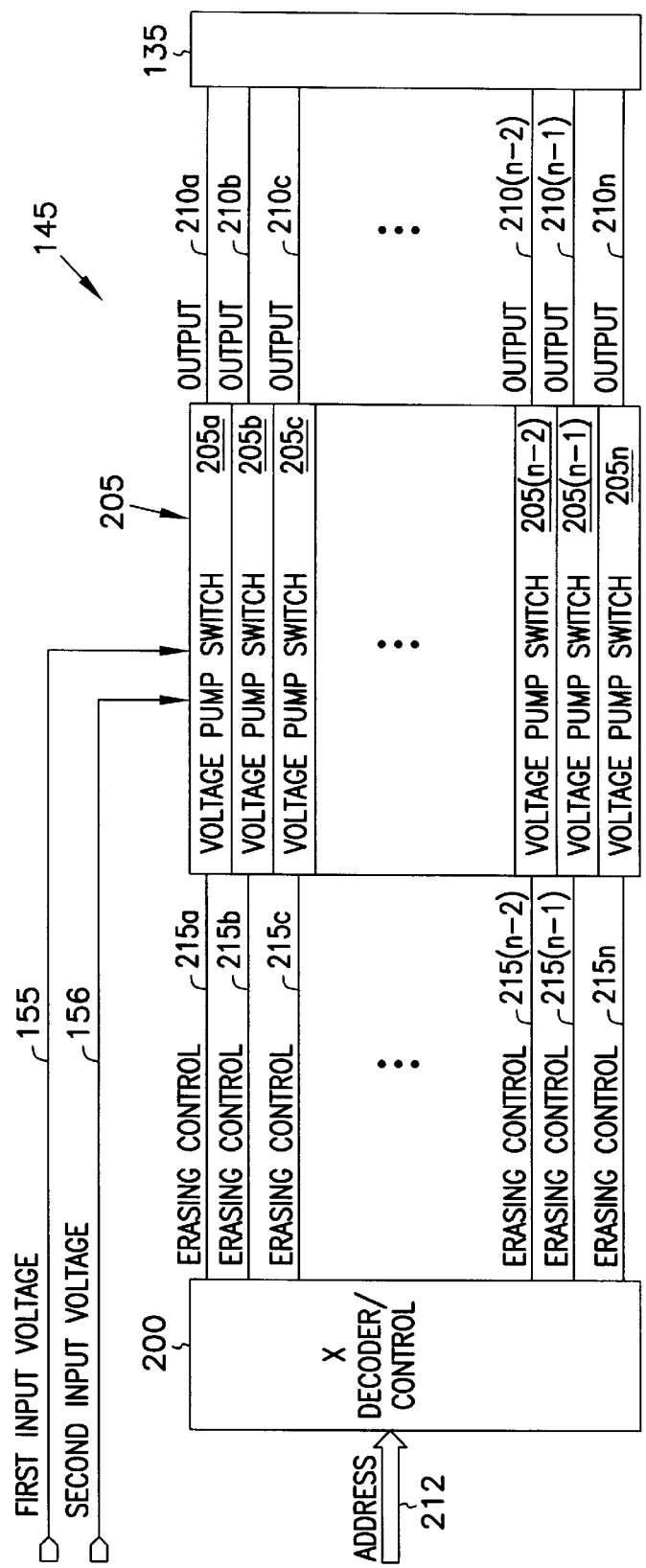
FIG. 2 is a schematic/block diagram that illustrates generally one embodiment of an interface circuit, such as the X-interface circuit of FIG. 1.

FIG. 2 is a schematic/block diagram that illustrates generally, by way of example, but not by way of limitation, one embodiment of an interface circuit, such as X-interface circuit 145, according to one aspect of the present invention. X-interface circuit 145 includes X decoder/control circuit 200 and voltage pump switches 205a, 205b, . . . , 205n, referred to generally as voltage pump switches 205. The actual number of voltage pump switches 205 depends on the number of separately erasable memory cell blocks in memory cell array 135. A separate one of voltage pump switches 205 is provided for each memory cell block in memory cell array 135. For example, for 32 memory cell blocks, 32 voltage pump switches 205 are provided.

Each voltage pump switch 205 multiplexes the first input voltage at node 155 and the second input voltage at node 156 to a corresponding one of voltage pump switch output nodes 210a, 210b, . . . , 210n, referred to generally as outputs 210. Each one of outputs 210 is coupled to a particular memory cell block in memory cell array 135. X decoder/control circuit 200 receives address signals 212 and provides each voltage pump switch 205 with a control signal, such as one of erasing control signals 210a, 215b, . . . , 215n, referred to generally as erasing control signals 215. Each erasing control signal 215 controls multiplexing by the corresponding voltage pump switch 205, such that the first input voltage at node 155 and the second input voltage at node 156 are not simultaneously coupled to the corresponding output 210.

Voltage Pump Switch

Figure 3:
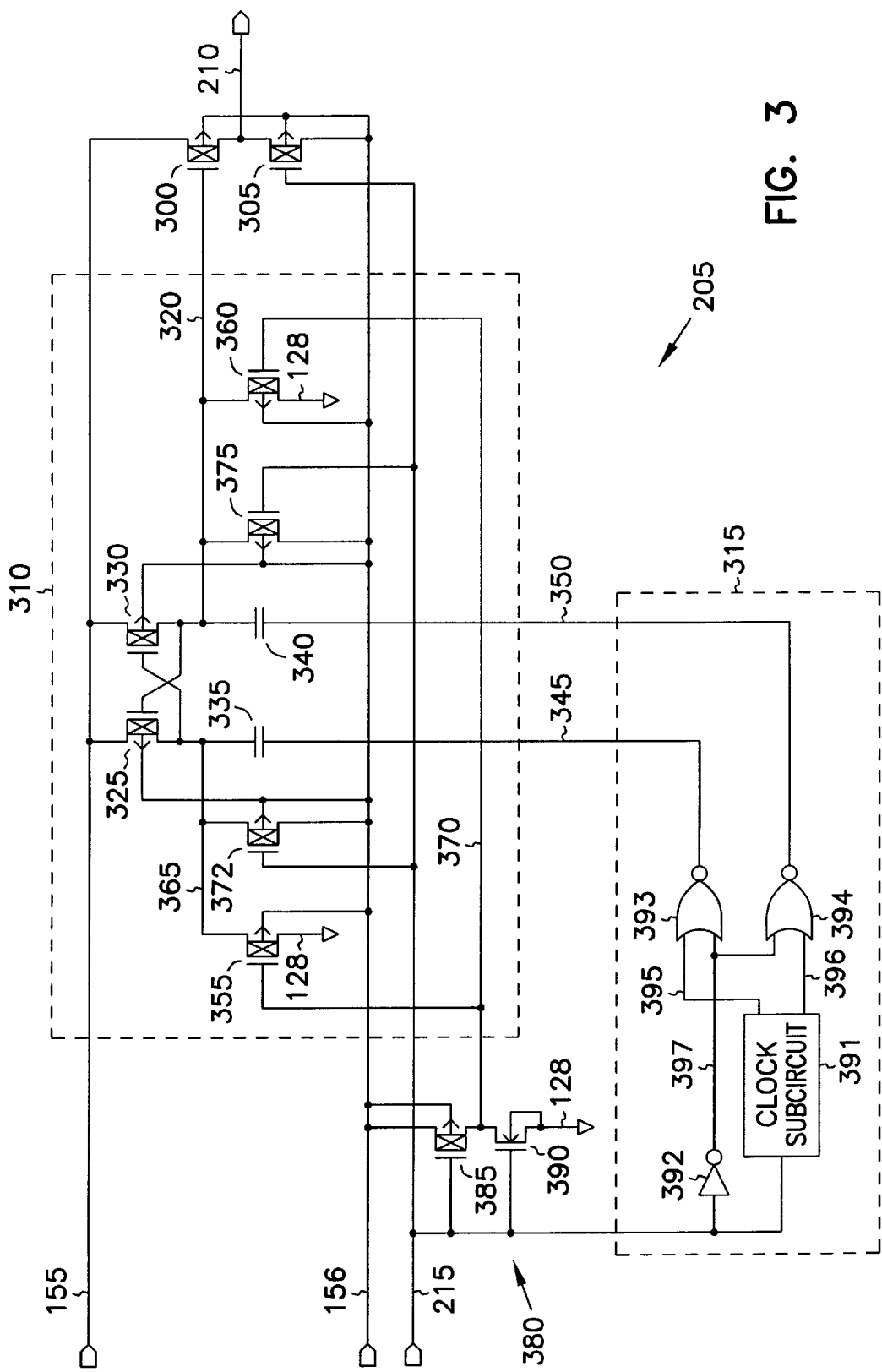
FIG. 3 is a schematic/block diagram that illustrates generally one embodiment of a voltage pump switch, such as illustrated in FIG. 2.

FIG. 3 is a schematic/block diagram that illustrates generally, by way of example, but not by way of limitation, one embodiment of a voltage pump switch 205, for implementing any of the voltage pump switches 205a–n of FIG. 2, according to one aspect of the present invention. Voltage pump switch 205 includes a first p-channel field-effect transistor (PFET) switch 300, a second PFET switch 305, a charge pump circuit 310, and a nonoverlapping clock generator circuit 315 that provides nonoverlapping active high clock signal outputs.

Voltage pump switch 205, as described below, routes both extreme positive and extreme negative voltages to a particular integrated circuit node, without incurring a threshold voltage drop across either of first PFET 300 or second PFET 305. Voltage pump switch 205 is useful for any such integrated circuit application; its utility is not limited to flash EEPROM applications. For an application requiring an extreme negative voltage, but not an extreme positive voltage, second PFET 305 is omitted, and voltage pump switch 205 provides the extreme negative voltage to the node without incurring a threshold voltage drop across first PFET 300. First PFET 300 can be located in close proximity to, or alternatively located remotely from the other circuits illustrated in FIG. 3.

In one embodiment, first PFET 300 includes a drain that is electrically coupled to the first input voltage at node 155, a gate receiving a first gate voltage at node 320, a source that is electrically coupled to output 210, and an n-well body that is electrically coupled to the second input voltage at node 156. First PFET 300 switchably electrically couples the first input voltage at node 155 to output 210 in response to a first gate voltage at node 320. During an erasing operation, the first input voltage at node 155 is a substantially negative voltage (e.g., an erasing voltage of approximately −10 Volts). During the erasing operation, voltage pump 205 provides a first gate voltage at node 320 that is based on the first input voltage at node 155. During the erasing operation, the first gate voltage at node 320 is more negative than the first input voltage at node 155 by at least turn-on threshold voltage ($v_T$) magnitude of first PFET 300. This first gate voltage at node 320 allows conduction of the −10 Volt erasing voltage from node 155 through first PFET 300 to output 210, as described below, and to a memory cell in memory cell array 135. When not performing an erasing operation, first PFET 300 isolates the first input voltage at node 155 from output 210.

In one embodiment, second PFET 305 includes a drain that is electrically coupled to output 210, a gate that is electrically coupled to the erasing control signal at node 215, a source that is electrically coupled to the second input voltage at node 156, and a body that is also electrically coupled to the second input voltage at node 156. Second PFET 305 electrically couples the second input voltage at node 156 to output 210 in response to a second gate voltage, such as provided by the erasing control signal at node 215. During a programming operation, the second input voltage at node 156 is an extreme positive voltage (e.g., a programming voltage of approximately +10 Volts). During the programming operation, the erasing control signal at node 215 provides a second gate voltage (e.g., approximately 0 Volts) that is more negative than second input voltage at node 156 by at least a turn-on threshold voltage ($v_T$) magnitude of second PFET 305, thereby allowing conduction of the second input voltage from node 156 through second PFET 305 to output 210.

Charge pump 310 provides a first gate voltage at node 320 that is more negative than the first input voltage at node 155 by at least a turn-on threshold voltage ($v_T$) magnitude of first PFET 300 in order to allow conduction of the −10 Volt erasing voltage through first PFET 300 to output 210. In one embodiment, charge pump 310 includes a first pump PFET 325 switch, a second pump PFET 330 switch, a first pump capacitor 335, and a second pump capacitor 340.

In one embodiment, first pump PFET 325 has a source that is electrically coupled to the first input voltage at node 155, a drain that is electrically coupled at node 365 to a first terminal of first pump capacitor 335, a gate that is electrically coupled at node 320 to a first terminal of second pump capacitor 340 and to a drain of second pump PFET 330, and a body that is electrically coupled to the second input voltage at node 156. Second pump PFET 330 has a source that is electrically coupled to the first input voltage at node 155, a drain that is electrically coupled at node 320 to the first terminal of second pump capacitor 340, a gate that is electrically coupled at node 365 to the first terminal of first pump capacitor 335 and to the drain of first pump PFET 325, and a body that is electrically coupled to the second input voltage at node 156. First pump capacitor 335 has a second terminal that is electrically coupled to receive a first clock signal at node 345 from nonoverlapping clock generator 315. Second pump capacitor 340 has a second terminal that is electrically coupled to receive a second clock signal at node 350 from nonoverlapping clock generator 315. The first and second clock signals at respective nodes 345 and 350 are nonoverlapping active high signals. In one embodiment, first and second pump capacitors 335 and 340, respectively, are each implemented as metal-oxide-semiconductor (MOS) capacitors, such as by a high voltage (e.g., thick gate dielectric) PFET. The PFET gate provides the first terminal of the pump capacitor, and the PFET source, drain, and body are electrically coupled together to provide the second terminal of the pump capacitor.

In one embodiment, charge pump 310 also includes PFETs 355 and 360 for initializing the voltages at respective nodes 365 and 320. When enabled, PFETs 355 and 360 initialize the voltages at respective nodes 365 and 320 to a voltage that is approximately a PFET $v_T$ magnitude more positive than $V_{ss}$ at node 128. PFETs 355 and 360 are enabled for performing their voltage initialization function during an erasing operation, for which erasing control signal 215 is a binary high logic level ("1"). PFET 355 has a drain that is electrically coupled to node 365. A gate of PFET 355 receives a voltage at node 370 that is inverted from the voltage of the erasing control signal at node 215 and level-shifted to provide a "1" logic level that is approximately equal to the second input voltage at node 156 and a binary low logic level ("0") that is approximately equal to the ground voltage $V_{ss}$ at node 128. A source of PFET 355 is electrically coupled to the ground voltage $V_{ss}$ at node 128, and a body of PFET 355 is electrically coupled to the second input voltage at node 156. PFET 360 has a drain that is electrically coupled to node 320, a gate that is electrically coupled to node 370, a source that is electrically coupled to the ground voltage $V_{ss}$ at node 128, and a body that is electrically coupled to the second input voltage at node 156.

In one embodiment, charge pump 310 also includes PFETs 372 and 375 acting as switches for electrically coupling respective nodes 365 and 320 to the second input voltage at node 156. PFETs 372 and 375 are disabled during erasing operations, for which the erasing control signal at node 215 is "1", and enabled otherwise. PFET 372 has a drain that is electrically coupled to node 365, a gate that receives the erasing control signal at node 215, a source that is electrically coupled to the second input voltage at node 156, and a body that is electrically coupled to the second input voltage at node 156. PFET 375 has a drain that is electrically coupled to node 320, a gate that is electrically coupled to receive the erasing control signal at node 215, a source that is electrically coupled to the second input voltage at node 156, and a body that is electrically coupled to the second input voltage at node 156.

In one embodiment voltage pump switch 205a includes a level-shifting inverter 380 including PFET 385 and NFET 390. PFET 385 has a drain that is electrically coupled to node 370, a gate that is electrically coupled to receive the erasing control signal at node 215, a source that is electrically coupled to receive the second input voltage at node 156, and a body that is electrically coupled to receive the second input voltage at node 156. NFET 390 has a drain that is electrically coupled to node 370, a gate that is electrically coupled to receive the erasing control signal at node 215, a source that is electrically coupled to ground voltage $V_{ss}$ at node 128, and a body that is electrically coupled to ground voltage $V_{ss}$ at node 128. Inverter 380 provides a binary logic level voltage at node 370 that is inverted from that of the erasing control signal at node 215 and level-shifted. As a result, node 370 provides a "1" logic level that is approximately equal to the second input voltage at node 156 and a "0" that is approximately equal to the ground voltage $V_{ss}$ at node 128. PFET 385, which provides the level-shifted "1" logic level, turns off during erasing operations when the erasing control signal at node 215 is "1" (e.g., approximately equal to $V_{cc}$) since the second input voltage at node 156 is decreased to between 0 Volt and 1 Volt during erasing operations, as set forth above in Table 1.

In one embodiment, nonoverlapping clock generator 315 includes clock subcircuit 391, inverter 392, first NOR gate 393, and second NOR gate 394. Clock subcircuit 391 receives the erasing control signal at node 215 and provides true and complement signals at respective nodes 395 and 396 to first inputs of first NOR gate 393 and second NOR gate 394, respectively. Inverter 392 receives the erasing control signal at node 215 and provides an inverted output signal at node 397 to second inputs of first NOR gate 393 and second NOR gate 394, respectively. During erasing operations, the erasing control signal at node 215 is "1", enabling clock subcircuit 391 for providing clocked true and complement signals at respective nodes 395 and 396. Otherwise, the erasing control signal at node 215 is "0", disabling clock subcircuit 391, resulting in a "0" at node 395 and a "1" at node 396. When enabled during an erasing operation by a "1" provided by the erasing control signal 215, nonoverlapping clock generator 315 provides a nonoverlapping active high clocked first and second clock signals at nodes 345 and 350, respectively. Otherwise, nonoverlapping clock generator 315 is disabled to save power, and provides an unclocked "0" at each of first and second clock signals at respective nodes 345 and 350.

Figure 4:
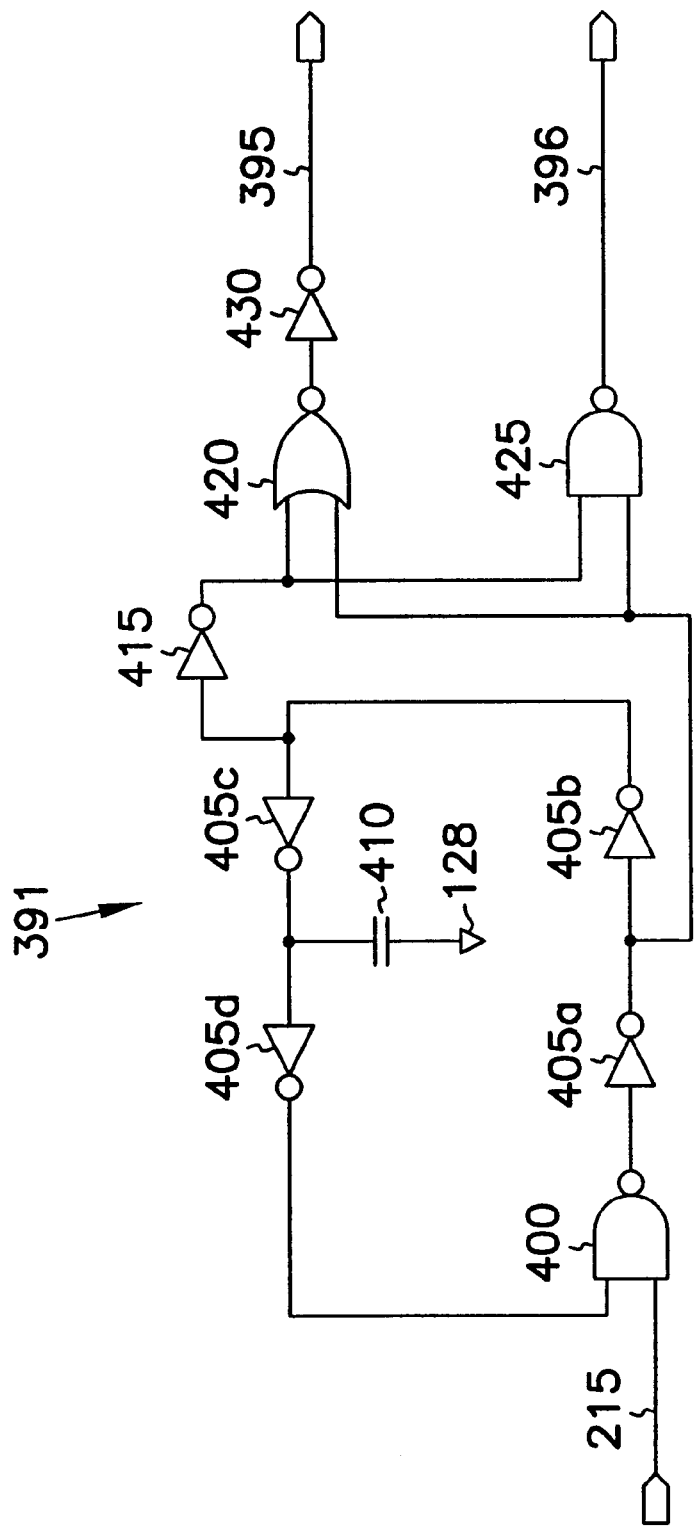
FIG. 4 is a schematic diagram that illustrates generally one embodiment of a clock circuit, such as illustrated in FIG. 3.

FIG. 4 is a schematic diagram that illustrates generally, by way of example, but not by way of limitation, one embodiment of clock subcircuit 391 according to one aspect of the present invention. In this embodiment, clock subcircuit 391 includes a ring oscillator comprising a ring-connected series cascade of NAND gate 400 and four inverters 405a, 405b, 405c, and 405d. NAND gate 400 receives the erasing control signal at node 215, which enables ring oscillator operation when "1" and disables ring oscillator operation when "0". In one embodiment, one or more delay elements, such as capacitor 410 shunting the output of inverter 405c to the ground voltage $V_{ss}$ at node 128, is included to adjust the ring oscillator frequency. Capacitor 410 can be implemented as a MOS capacitor, such as by electrically coupling an NFET gate to the output of inverter 405c and electrically coupling source, drain, and body regions of the NFET to the ground voltage level $V_{ss}$ at node 128. Inverter 415 receives the output of inverter 405b, and provides a first ring oscillator output to first inputs of NOR gate 420 and NAND gate 425. Inverter 405a provides a second ring oscillator output to second inputs of NOR gate 420 and NAND gate 425. The output of NOR gate 420 is electrically coupled to node 395 through inverter 430. The output of NAND gate 425 is electrically coupled to node 396.

Figure 5:
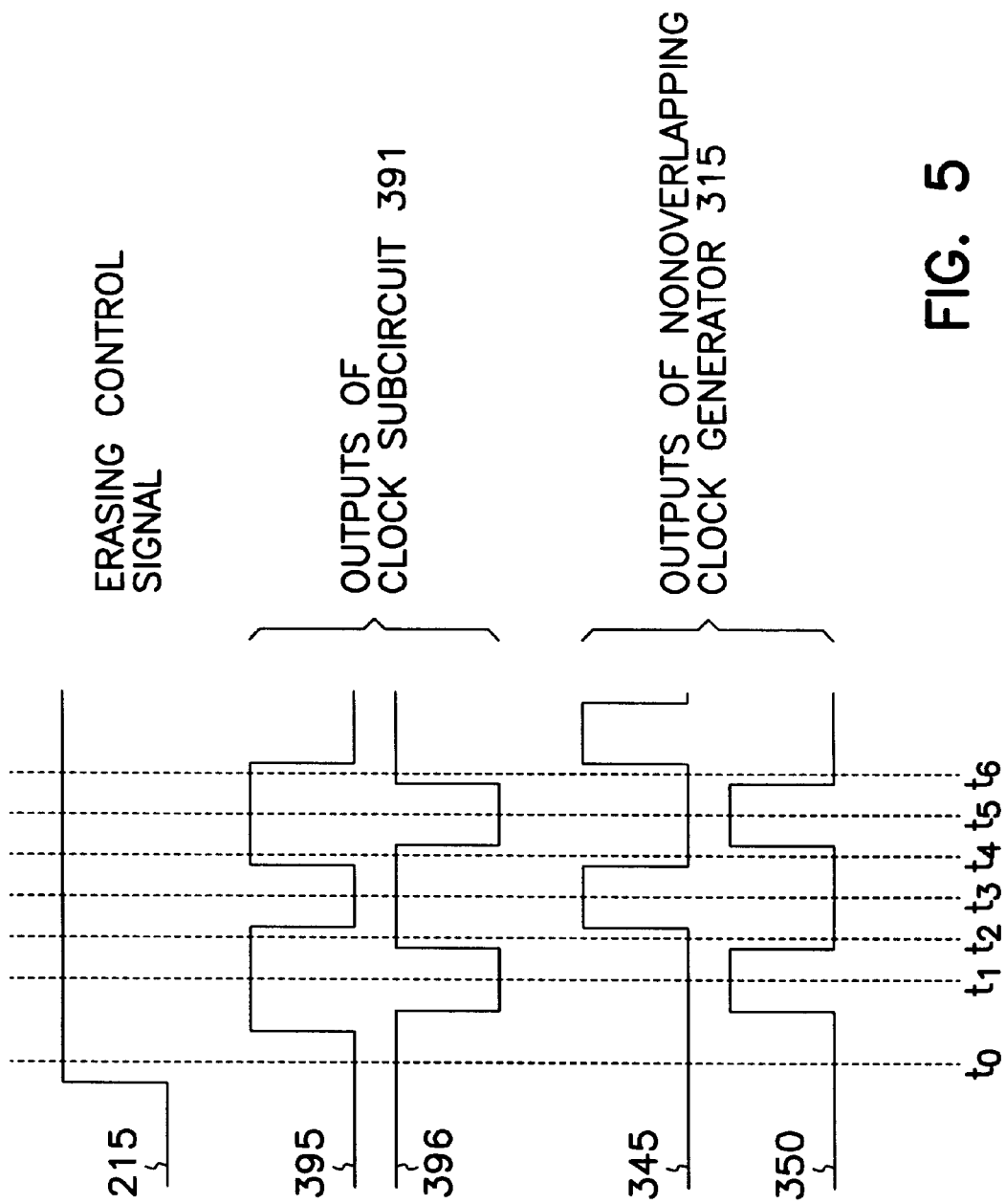
FIG. 5 is a timing diagram illustrating generally one embodiment of timing signals corresponding to particular nodes of the voltage pump switch of FIG. 3.

FIG. 5 is a timing diagram illustrating generally one embodiment of certain timing signals corresponding to particular nodes of the voltage pump switch 205a of FIG. 3. The erasing control signal at node 215 is "0" except during an erasing operation, when the erasing control signal provides a "1" at node 215. Outputs of clock subcircuit 391 are unclocked (e.g., node 395 at "0" and node 396 at "1") except during an erasing operation, when nodes 395 and 396 provide clocked nonoverlapping active low logic levels. Outputs of nonoverlapping clock generator 315 are unclocked (e.g., nodes 345 and 350 each at "0") except during an erasing operation, when nodes 345 and 350 provide clocked nonoverlapping active high logic levels.

Memory IC Operation

Operation of memory IC 110 includes performing block erasing operations and programming operations. During an erasing operation, the first input voltage at node 155 is an extreme negative erasing voltage of about −10 Volts, which is more negative than a reference voltage, such as the 0 Volt substrate ground voltage $V_{ss}$ at node 128. The second input voltage at node 156 is more positive than or equal to the 0 Volt substrate ground voltage $V_{ss}$ at node 128. A memory cell block in memory cell array 135 is selected. The second input voltage at node 156 is isolated from the selected memory cell block in memory cell array 135 by the second PFET 305 in the corresponding voltage pump switch 205. The first input voltage at node 155 is isolated from the other, nonselected, memory cell blocks in memory cell array 135 by the first PFET 300 in the corresponding voltage pump switch 205. The second input voltage at node 156 is electrically coupled to nonselected memory cell blocks in memory cell array 135 by the second PFET 305 in corresponding ones of voltage pump switches 205. The first input voltage at node 155 is electrically coupled to the selected memory cell block in memory cell array 135 by the first PFET 300 in the corresponding voltage pump switch 205.

During a read or write/programming operation, the second input voltage at node 156 is more positive than the ground voltage $V_{ss}$ at node 128. During a write/programming operation, the second input voltage at node 156 provides an extreme positive programming voltage, such as approximately +10 Volts. During a read operation, the second input voltage at node 156 provides an read voltage, such as approximately +7 Volts. During a read or write/programming operation, the first input voltage at node 155 is switched to the ground voltage $V_{ss}$ at node 128 or to the positive power supply voltage $V_{cc}$ at node 126. A memory cell block in memory cell array 135 is selected. The first input voltage at node 155 is isolated from the selected memory cell block in memory cell array 135, such as by the first PFET 300 in the corresponding voltage pump switch 205. The second input voltage at node 156 is coupled to the selected memory cell block in memory cell array 135, such as by the second PFET 305 in the corresponding voltage pump switch 205.

Voltage pump switch 205a provides standard single well (e.g., n-well) CMOS process compatible multiplexing of the first input voltage at node 155 and the second input voltage at node 156 to output 210, depending on the value of the erasing control signal at node 215. The erasing control signal at node 215 is "1" during erasing operations, and "0" otherwise. During an erasing operation, for which the erasing control signal at node 215 is "1", PFET 300 couples the first input voltage at node 155 to output 210. Otherwise, the erasing control signal at node 215 is "0", PFET 300 is turned off, and PFET 305 couples the second input voltage 156 to output 210.

Read and Write Operations

As set forth above in Table 1, the second input voltage at node 156 can be an extreme positive voltage during read and write operations, for which the erasing control signal at node 215 is "0". During a read operation, the second input voltage at node 156 is charge pumped to approximately +7 Volts by the positive charge pump in $V_{pp}$ Switch/Pump 160 while the integrated circuit substrate is held at a reference voltage such as ground voltage $V_{ss}$ at node 128, which is approximately equal to 0 Volts. During a write/programming operation, the second input voltage at node 156 is charge pumped to approximately +10 Volts by the positive charge pump in $V_{pp}$ pump 160 while the integrated circuit substrate is held at a reference voltage such as the ground voltage $V_{ss}$ at node 128, which is approximately equal to 0 Volts. During an erasing operation, for which the erasing control signal at node 215 is "1", the positive charge pump in $V_{pp}$ pump 160 is turned off, and the second input voltage at node 156 is switched to a reference voltage. During the erasing operation, the second input voltage at node 156 is switched to the substrate voltage (e.g., 0 Volts) or alternatively switched to a reference voltage that is different than the substrate voltage, as described below.

When the erasing control signal at node 215 is "0", the second input voltage at node 156 is more positive than the first input voltage at node 155, as seen from Table 1. Second PFET 305 is on, thereby electrically coupling the second input voltage at node 156 to output 210. PFETs 372 and 375 are also turned on, thereby electrically coupling the second input voltage at node 156 to nodes 365 and 320, respectively. The resulting first gate voltage at node 320 turns first PFET 300 off, thereby electrically isolating the first input voltage at node 155 from output 210. Node 370 is "1" (level-shifted up to the most positive second input voltage at node 156), thereby turning off PFETs 355 and 360 and isolating, from $V_{ss}$ at node 128, nodes 365 and 320, respectively. First and second pump PFETs 325 and 330, respectively, are turned off, since their gates are coupled to the second input voltage at node 156 through respective PFETs 375 and 372.

Erasing Operation

As set forth above in Table 1, the first input voltage at node 155 can be an extreme negative voltage (e.g., approximately −10 Volts) during erasing operations, for which the erasing control signal at node 215 is "1". While the substrate of memory IC 110 is held at a reference voltage such as the ground voltage $V_{ss}$ at node 128, which is approximately equal to 0 Volts, the first input voltage at node 155 is charge pumped to approximately −10 Volts by the negative charge pump in $V_{pp}$ pump 160. When the erasing control signal at node 215 is at "0", the negative charge pump in $V_{pp}$ pump 160 is turned off, and the first input voltage at node 155 is switched to a reference voltage, such as ground voltage $V_{ss}$ at node 128 at approximately 0 Volts or positive power supply voltage $V_{cc}$ at node 126 at approximately 3.3 Volts or 5 Volts.

During an erasing operation, the erasing control signal at node 215 is "1". The second input voltage at node 156 is reduced to approximately between 0 Volt and 1 Volt, which is lower than the positive power supply voltage $V_{cc}$ at node 126, as seen in Table 1. As a result, second PFET 305 is turned off, thereby isolating the second input voltage at node 156 from output 210. PFETs 372 and 375 are turned off, thereby isolating the second input voltage at node 156 from respective nodes 365 and 320. PFET 385 is also turned off, and node 370 is electrically coupled to the ground voltage $V_{ss}$ at node 128 through NFET 390. If the voltage at node 365 exceeds the ground voltage $V_{ss}$ at node 128 by more than the $V_T$ magnitude of PFET 355, then PFET 355 will turn on and conduct until the voltage at node 365 is reduced to a voltage that is approximately the $V_T$ magnitude of PFET 355 above the ground voltage $V_{ss}$ at node 128. Similarly, if the voltage at node 320 exceeds the ground voltage $V_{ss}$ at node 128 by more than the $V_T$ magnitude of PFET 360, then PFET 360 will turn on and conduct until the voltage at node 320 is reduced to a voltage that is approximately the $V_T$ magnitude of PFET 360 above the ground voltage $V_{ss}$ at node 128.

As set forth above, during the erasing operation, the second input voltage at node 156 reduced to approximately between 0 Volt and 1 Volt. In one embodiment, the second input voltage at node 156 is switched to the substrate voltage (e.g., at ground voltage $V_{ss}$=0 Volts). In another embodiment, the second input voltage at node 156 is switched to a reference voltage that is different than the substrate voltage. For example, if the substrate is at the ground voltage $V_{ss}$=0 Volts, the second input voltage at node 156 is switched to approximately a PFET $V_T$ magnitude (e.g., approximately 1 Volt) above $V_{ss}$. This advantageously allows PFETs 355 and 360 to initialize to the voltages at respective node 365 and 320 to approximately 0 Volts, rather than to approximately a PFET $V_T$ magnitude (e.g., approximately 1 Volt) above $V_{ss}$, as described above where the second input voltage at node 156 is at 0 Volts. This also ensures that PFETs 325 and 330 are initially off (i.e., subthreshold leakage currents are minimized), as illustrated in FIG. 6A.

In order for first PFET 300 to pass the extreme negative erasing voltage of approximately −10 Volts from node 155 to output 210 during an erasing operation, charge pump 310 pumps the first gate voltage at node 320 to a voltage that is more negative than the first input voltage at node 155 by approximately the $V_T$ magnitude of first PFET 300, as described below. During an erasing operation, the erasing control signal at node 215 is "1", thereby activating (clocking) the first and second clock signals at respective nodes 345 and 350, as illustrated in FIG. 5.

FIGS. 6A, 6B, 6C, 6D, 6E, 6F, and 6G are simplified schematic diagrams of a portion of charge pump 310 and associated node voltages that illustrate generally, by way of example, but not by way of limitation, operating states of charge pump 310 at respective times $t_0$, $t_1$, $t_2$, $t_3$, $t_4$, $t_5$, and $t_6$ illustrated in FIG. 5. For the illustrative purposes of this example, all PFET $V_T$ magnitudes are assumed to be approximately +1 Volt, the positive power supply voltage $V_{cc}$ at node 126 is assumed to be approximately +5 Volts, and the first input voltage at node 155 is assumed to be approximately −10 Volts when erasing control signal 215 is "1" and approximately 0 Volts otherwise. It is understood that these values are selected only to provide clarity for the illustrative example, and that the exact values can vary according to the particular implementation of the present invention.

Figure 6A:
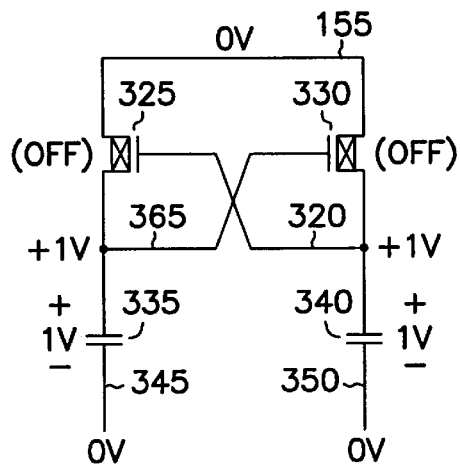
FIGS. 6A, 6B, 6C, 6D, 6E, 6F, and 6G are simplified schematic diagrams that illustrate generally the charge pump operating state at respective times $t_0$, $t_1$, $t_2$, $t_3$, $t_4$, $t_5$, and $t_6$ of FIG. 5.

FIG. 6A illustrates generally the initial state of charge pump 310 at time $t_0$ after erasing control signal 215 is brought high. The second input voltage at node 156 is reduced to approximately between 0 and +1 Volt. The first input voltage at node 155 is approximately −10 Volts since the erasing control signal is "1". Nodes 365 and 320 are approximately +1 Volt, as established by clamping operation of PFETs 355 and 360 described above. First and second clock signals at respective nodes 345 and 350 are each at approximately 0 Volts, as illustrated in FIG. 5.

Figure 6B:
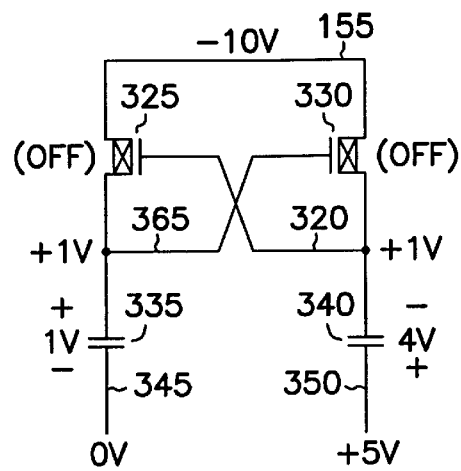

FIG. 6B illustrates generally the state of charge pump 310 at time $t_1$. The first clock signal at node 345 remains at approximately 0 Volts, and the second clock signal provides approximately +5 Volts at node 350. The first input voltage at node 155 remains at approximately −10 Volts. Nodes 365 and 320 remain at approximately +1 Volt through the clamping operation of respective PFETs 355 and 360.

Figure 6C:
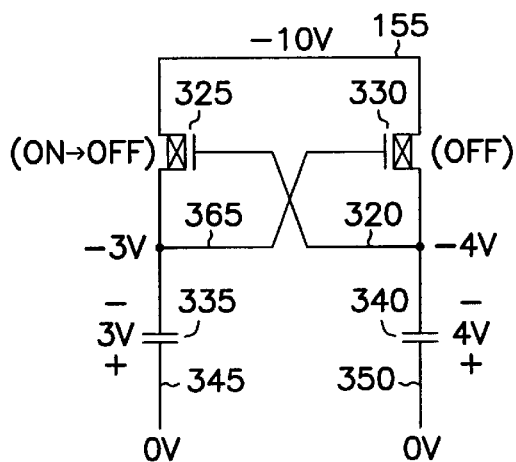

FIG. 6C illustrates generally the state of charge pump 310 at time $t_2$. The first clock signal at node 345 remains at approximately 0 Volts. The second clock signal at node 350 is returned to approximately 0 Volts, establishing the voltage of node 320 at approximately −4 Volts. This turns on first pump PFET 325 until the voltage at node 365 becomes approximately −3 Volts, after which time first pump PFET 325 turns off.

Figure 6D:
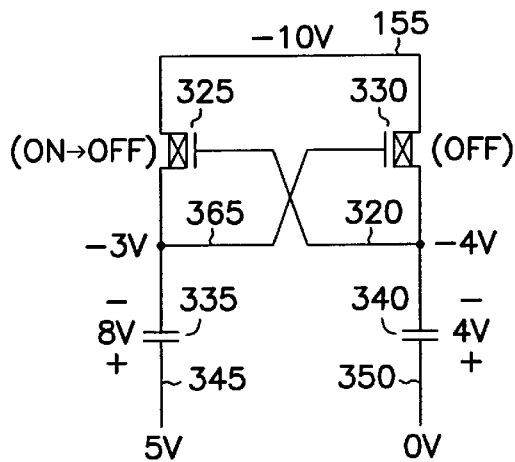

FIG. 6D illustrates generally the state of charge pump 310 at time $t_3$. The second clock signal at node 350 remains at approximately 0 Volts. The first clock signal provides approximately +5 Volts at node 345. First pump PFET 325 turns on to hold the voltage at node 365 at approximately −3 Volts while a new voltage is established across first pump capacitor 335, after which time first pump PFET 325 turns off.

Figure 6E:
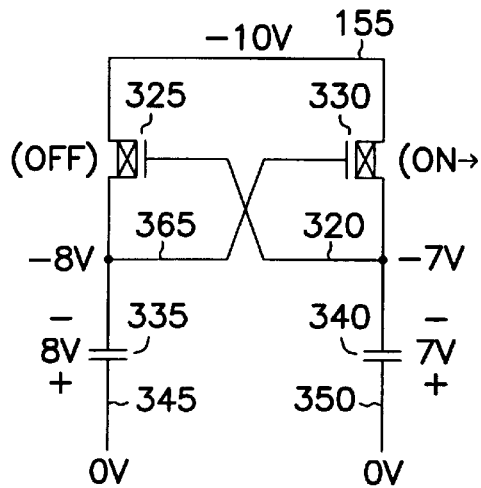

FIG. 6E illustrates generally the state of charge pump 310 at time $t_4$. The second clock signal at node 350 remains at approximately 0 Volts. The first clock signal at node 345 is returned to approximately 0 Volts, providing approximately −8 Volts at node 365. This turns on second pump PFET 330, which conducts until the voltage at node 320 becomes approximately −7 Volts, after which time second pump PFET 330 turns off.

Figure 6F:
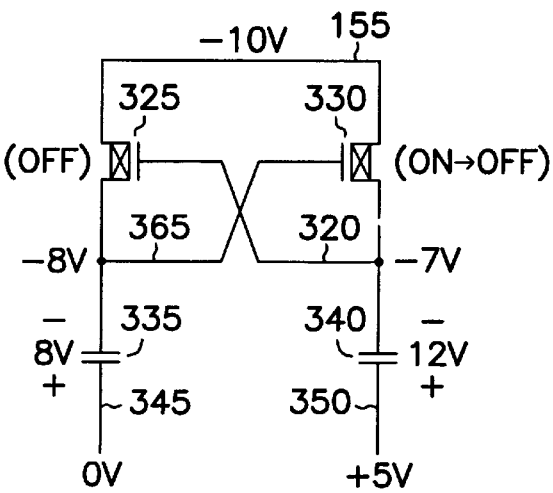

FIG. 6F illustrates generally the state of charge pump 310 at time $t_5$. The first clock signal at node 345 remains at approximately 0 Volts. The second clock signal provides approximately +5 Volts to node 350. Second pump PFET 330 turns on to hold the voltage at node 320 at approximately −7 Volts while a new voltage is established across second pump capacitor 340, after which time second pump PFET 330 turns off.

Figure 6G:
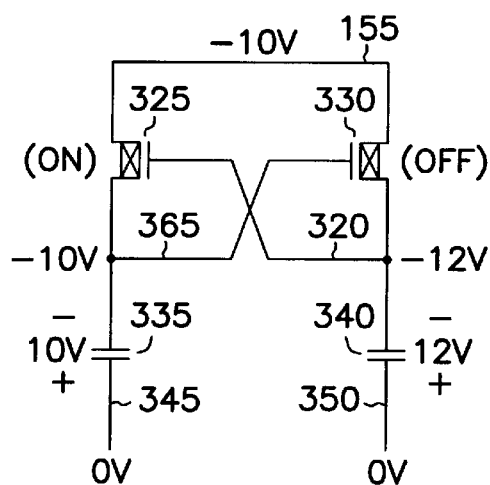

FIG. 6G illustrates generally the state of charge pump 310 at time $t_6$. The first clock signal at node 345 remains at approximately 0 Volts. The second clock signal returns node 350 to approximately 0 Volts. This turns on first pump PFET 325 such that node 365 becomes approximately −10 Volts, establishing a new voltage across first pump capacitor 335. It will be appreciated by those skilled in the art that continued cycling operation of charge pump 310 provides a first gate voltage at node 320 that is more negative than the first input voltage at node by more than the +1 Volt $V_T$ magnitude of PFET 300 (e.g., the first input voltage at node 155 is about −10 Volts, and the first gate voltage at node 320 is more negative than −11 Volts). This allows first PFET 300 to turn on and conduct the first input voltage from node 155 to output 210.

From FIGS. 6A through 6G and FIG. 3, it is seen that lowering the second input voltage at node 156 during erasing operations helps avoid voltage-induced beakdown. The PFETs in voltage pump switch 205 that are coupled to the extreme negative (e.g., −10 Volt) first input voltage at node 155, or the even more negative first gate voltage at node 320 (e.g., −11 to −12 Volts), may be susceptible to avalanche drain-to-source breakdown if the second input voltage at node 156 is not reduced during erasing operations, as described above.

For example, if the second input voltage at node 156 were left at the programming voltage of approximately +10 Volts, second PFET 305 would have a voltage magnitude of approximately 20 Volts between its drain and source. Such a large voltage difference would exceed the breakdown voltage of second PFET 305, for example. For one typical fabrication process, the PFET breakdown voltage is typically approximately 13 Volts between the drain and source of the PFET or between the drain and body of the PFET. By lowering the second input voltage at node 156 to approximately 1 Volt during an erasing operation, the second PFET 305 has a drain-to-source voltage magnitude of approximately 11 Volts, which is less than the typical drain-to-source breakdown voltage of 13 Volts.

Voltage-induced breakdown in other PFETs is similarly avoided. For example, by lowering the second input voltage at node 156 to approximately 1 Volt during an erasing operation, PFET 360 has a drain-to-body voltage magnitude of approximately 13 Volts, when the first gate voltage at node 320 is charge-pumped to approximately −12 Volts during the erasing operation.

The second input voltage at node 156 could be reduced, during an erasing operation, to a voltage that is higher than 1 Volt if the particular process provides larger drain-to-source breakdown voltage magnitudes. The second input voltage at node 156 is not lowered below the 0 Volt ground voltage $V_{ss}$ at node 128, since doing so could forward bias certain PFET source-body diodes (e.g., PFET 360), leading to unwanted current conduction or possible CMOS latchup.

Conclusion

One aspect of the present invention provides switching for negative voltages, such as for selective application of a negative erasing voltage to particular blocks of memory integrated circuit (e.g., a flash memory having floating gate transistor memory cells), that is compatible with a standard single well (i.e., n-well) complementary metal-oxide-semiconductor (CMOS) process. A voltage pump switch uses a PFET to route an extreme negative erasing voltage to a particular memory cell block in a memory cell array. In order to pass the extreme negative erasing voltage, the gate of the PFET is charge-pumped to a voltage that is more negative than the extreme negative erasing voltage by the magnitude of the PFET turn-on threshold voltage. The present invention is also capable of routing extreme positive voltages to a particular block of memory cells, such as for reading or write/programming operations.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A integrated circuit having a reference voltage level applied to its substrate, the integrated circuit comprising:
   a first PFET, having a gate and, based on a first gate voltage at the gate of the first PFET, switchably electrically coupling a first input voltage to an output, wherein the first input voltage is more negative than the reference voltage level; and
   a second PFET, having a gate and, based on a second gate voltage at the gate of the second PFET, switchably electrically coupling a second input voltage to the output, wherein the second input voltage is more positive than or equal to the reference voltage level.

2. The integrated circuit of claim 1, wherein the first and second input voltages are not simultaneously coupled to the output.

3. The integrated circuit of claim 1, wherein the first PFET has a turn-on threshold voltage ($v_T$) magnitude and switchably electrically couples the first input voltage to the output when a magnitude of a difference between the first gate voltage and the reference voltage exceeds the $V_T$ magnitude of the first PFET.

4. The integrated circuit of claim 1, wherein the first gate voltage is based on the first input voltage.

5. The integrated circuit of claim 1, further comprising a charge pump electrically coupled to the gate of the first PFET and providing the first gate voltage thereto.

6. The integrated circuit of claim 5, wherein the charge pump is electrically coupled between the first input voltage and the gate of the first PFET.

7. The integrated circuit of claim 6, in which the charge pump comprises:
   a first and a second pump switch, each electrically coupled to the first input voltage;
   a first pump capacitor electrically coupled to the first input voltage through the first pump switch and also electrically coupled to receive a first clock signal; and
   a second pump capacitor electrically coupled to the first input voltage through the second pump switch and also electrically coupled to receive a second clock signal.

8. The integrated circuit of claim 7, further comprising a nonoverlapping clock generator providing the first and second clock signals.

9. The integrated circuit of claim 7, wherein the first and second clock signals are nonoverlapping active high signals.

10. The integrated circuit of claim 7, wherein the first pump switch includes a PFET having a drain coupled to the first pump capacitor and the second pump switch includes a PFET having a drain coupled to the second pump capacitor.

11. The circuit of claim 10, wherein the source of each one of the first and second pump switches is coupled to the first input voltage, and the gate of each one of the first and second pump switches is coupled to the drain of the other of the first and second pump switches.

12. The integrated circuit of claim 1, wherein the second input voltage is decreased toward the reference voltage level during at least a portion of a time when the first input voltage is coupled to the output.

13. The integrated circuit of claim 12, wherein the second input voltage is decreased to a value that avoids exceeding a drain-to-source breakdown voltage of at least one of the first and second PFETs while the first input voltage is coupled to the output.

14. The integrated circuit of claim 13, wherein the value to which the second input voltage is decreased exceeds the reference voltage by approximately a turn-on threshold voltage ($V_T$) magnitude of at least one of the first and second PFETs.

15. The circuit of claim 1, wherein a magnitude of a difference between the first and second input voltages is capable of exceeding a drain-to-source breakdown voltage of at least one of the first and second PFETs.

16. The circuit of claim 1, wherein a magnitude of a difference between the first and second input voltages is capable of exceeding approximately 20 Volts.

17. The circuit of claim 1, further comprising a control signal controlling the first and second gate voltages.

18. A integrated circuit having a reference voltage level applied to its substrate, the integrated circuit comprising:
a first PFET, having a gate and, based on a first gate voltage at the gate of the first PFET, switchably electrically coupling a first input voltage to an output, wherein the first input voltage is more negative than the reference voltage level; and
a charge pump electrically coupled between the first input voltage and the gate of the first PFET.

19. The integrated circuit of claim 18, wherein the charge pump comprises:
a first pump capacitor, having first and second terminals, the second terminal of the first pump capacitor electrically coupled to receive a first clock signal;
a second pump capacitor, having first and second terminals, the second terminal of the second pump capacitor electrically coupled to receive a second clock signal;
a first pump PFET, having a drain electrically coupled to the first terminal of the first pump capacitor, a gate, and a source electrically coupled to the first input voltage;
a second pump PFET, having a drain electrically coupled to the first terminal of the second pump capacitor and to the gate of the first pump PFET, a gate electrically coupled to the source of the first pump PFET, and a source electrically coupled to the first input voltage.

20. The integrated circuit of claim 18, further comprising:
a second PFET, having a gate and, based on a second gate voltage at the gate of the second PFET, switchably electrically coupling a second input voltage to the output, wherein the second input voltage is more positive than or equal to the reference voltage level.

21. A memory comprising:
an erasing voltage that is more negative than a substrate reference voltage;
at least one programming voltage that is more positive than or equal to the reference voltage;
an array of memory cells, each memory cell including a floating gate transistor having a control gate, and constructed to respond to the at least one programming voltage to change to at least one programmed state, and also constructed to respond to the erasing voltage to change to an erased state; and
a first p-channel field-effect transistor (PFET) switch, having a gate and, based on a first gate voltage at the gate of the first PFET, switchably electrically coupling the erasing voltage to at least one memory cell.

22. The memory of claim 21, further comprising a second switch, switchably electrically coupling the programming voltage to the at least one memory cell.

23. The memory of claim 22, wherein the second switch is a PFET switch, having a gate, and based on a second gate voltage at the gate of the second PFET, switchably electrically coupling the programming voltage to the at least one memory cell.

24. The memory of claim 22, further comprising an erasing control signal controlling the first gate voltage.

25. The memory of claim 24, wherein the erasing control signal also controls the second gate voltage.

26. A method of using a memory, the method comprising:
receiving a first input voltage that is more negative than a substrate reference voltage;
receiving a second input voltage that is more positive than or equal to the reference voltage;
isolating the second input voltage from a selected block of memory cells;
isolating, by a second p-channel field-effect transistor (PFET), the first input voltage from the nonselected blocks of memory cells;
coupling the second input voltage to nonselected blocks of memory cells; and
coupling, through a first PFET, the first input voltage to the selected block of memory cells.

27. The method of claim 26, wherein coupling the first input voltage to the selected block of memory cells includes providing at a gate terminal of the first PFET a voltage that is more negative than the first input voltage.

28. The method of claim 26, further comprising:
isolating, by the first PFET, the first input voltage from the selected block of memory cells; and
coupling, through the second PFET, the second input voltage to the selected block of memory cells.

29. A method of programming a memory, the method comprising:
receiving a first input voltage;
receiving a second input voltage that is more positive than or equal to a substrate reference voltage;
isolating, by a first p-channel field-effect transistor PFET), the first input voltage from a selected block of memory cells; and
coupling, through a second PFET, the second input voltage to the selected block of memory cells.

30. A voltage pump switch for multiplexing a first input voltage, which is more negative than a substrate reference voltage level, and a second input voltage, which is more positive than or equal to the substrate reference voltage level, to an output, the circuit comprising:
a first p-channel field-effect transistor (PFET), having a drain electrically coupled to the first input voltage, a gate, a source electrically coupled to the output, and a body electrically coupled to the second input voltage, wherein the first PFET switchably electrically couples the first input voltage to the output;

a second PFET, having a drain electrically coupled to the output, a gate, a source electrically coupled to the second input voltage, and a body electrically coupled to the second input voltage, wherein the second PFET switchably electrically couples the second input voltage to the output;

a nonoverlapping clock generator providing active low nonoverlapping first and second clock signals; and a charge pump electrically interposed between the first input voltage and the gate of the first PFET, and controllably providing at the gate of the first PFET a voltage that is more negative than the first input voltage, wherein the charge pump includes:
- a first pump capacitor, having first and second terminals, the second terminal of the first pump capacitor electrically coupled to receive the first clock signal;
- a second pump capacitor, having first and second terminals, the second terminal of the second pump capacitor electrically coupled to receive the second clock signal;
- a first PFET pump switch, having a source electrically coupled to the first input voltage, a drain electrically coupled to the first terminal of the first pump capacitor, a gate, and a body electrically coupled to the second input voltage; and
- a second PFET pump switch, having a source electrically coupled to the first input voltage, a drain electrically coupled to the first terminal of the second pump capacitor and to the gate of the first PFET pump switch, a gate electrically coupled to the drain of the first PFET pump switch, and a body electrically coupled to the second input voltage.

31. A integrated circuit comprising:

a first PFET, having a gate and, based on a first gate voltage at the gate of the first PFET, switchably electrically coupling a first input voltage to an output at a first time; and a second PFET, having a gate and, based on a second gate voltage at the gate of the second PFET, switchably electrically coupling a second input voltage to the output at a second time, wherein a magnitude of a difference between the first and second input voltages is capable of exceeding a drain-to-source breakdown voltage of at least one of the first and second PFETs.

32. The integrated circuit of claim 31 wherein one of the first and second voltages is more negative than a reference voltage level applied to the integrated circuit's substrate.

33. An integrated circuit comprising:

a first PFET, having a gate and, based on a first gate voltage at the gate of the first PFET, switchably electrically coupling a first input voltage to an output at a first time; and a second PFET, having a gate and, based on a second gate voltage at the gate of the second PFET, switchably electrically coupling a second input voltage to the output at a second time, wherein the magnitude of the second voltage is lowered at the first time, so that the magnitude of a difference between the first and second input voltages does not exceed a drain-to-source breakdown voltage of at least one of the first and second PFETs at the first time.

34. The integrated circuit of claim 33 wherein one of the first and second voltages is more negative than a reference voltage level applied to the integrated circuit's substrate.

* * * * *